(12) United States Patent
Zhang et al.

(10) Patent No.: US 8,081,013 B1
(45) Date of Patent: Dec. 20, 2011

(54) DIGITAL PHASE AND FREQUENCY DETECTOR

(75) Inventors: Weicheng Zhang, Shanghai (CN); Ming Shi, Shanghai (CN); Wei-Hua Zou, Shanghai (CN); Shu-Sun Yu, Cupertino, CA (US); Chieh-Yuan Chao, Fremont, CA (US)

(73) Assignee: Amlogic Co., Ltd., Santa Clara, CA (US)

( * ) Notice: Subject to any disclaimer, the term of this patent is extended or adjusted under 35 U.S.C. 154(b) by 0 days.

(21) Appl. No.: 12/835,689

(22) Filed: Jul. 13, 2010

(51) Int. Cl.
*G01R 25/00* (2006.01)
*H03D 13/00* (2006.01)

(52) U.S. Cl. ......... 327/3; 327/2; 327/7; 327/12; 331/25; 324/76.77; 324/76.82

(58) Field of Classification Search .............. 327/2, 3, 327/5, 7–10, 12; 331/25; 324/76.77, 76.82
See application file for complete search history.

(56) References Cited

U.S. PATENT DOCUMENTS

| | | | | |
|---|---|---|---|---|
| 4,879,527 A | * | 11/1989 | Geile et al. | 331/1 A |
| 5,818,265 A | * | 10/1998 | Meller et al. | 327/6 |
| 5,883,536 A | * | 3/1999 | Patterson | 327/184 |
| 7,304,510 B2 | * | 12/2007 | Matsuta | 327/3 |
| 7,859,344 B2 | * | 12/2010 | Uozumi et al. | 331/1 A |
| 2010/0097150 A1 | * | 4/2010 | Ueda et al. | 331/25 |
| 2010/0327912 A1 | * | 12/2010 | Chiu et al. | 327/5 |

* cited by examiner

*Primary Examiner* — Patrick O'Neill
(74) *Attorney, Agent, or Firm* — Venture Pacific Law, PC

(57) ABSTRACT

A method for digital phase detection, comprises the steps of: providing a reference clock; receiving a feedback clock; determining a timing difference between the reference clock and the feedback clock; determining a polarity that indicates the leading or lagging relationship between the reference clock and the feedback clock; adaptively selecting one of at least two operating modes for generating a quantized level indicative of the timing difference, wherein in a first operating mode the quantized level is a constant maximum value and wherein in a second operating mode the quantized level is proportional to the timing difference; and generating a digital phase detection output as a combination of the polarity and the quantized level.

23 Claims, 7 Drawing Sheets

DIGITAL PHASE AND FREQUENCY DETECTOR

FIELD OF INVENTION

This invention relates to a digital phase and frequency detector ("DPFD"), and, in particular, to a digital phase and frequency detector that can separately detect the polarity and magnitude of the phase difference of input signals and has at least two operating modes which can be adaptively switched.

BACKGROUND

Generally in electronics, a digital phase and frequency detector ("DPFD") is a device which compares the phase and frequency of two input signals. The two inputs usually correspond to a voltage-controlled oscillator ("VCO"), as a feedback signal, and an external source as a reference signal. The DPFD can have two outputs for providing information to other circuitry for phase locking. To form a phase-locked loop ("PLL"), the DPFD's phase error output is fed to a loop filter which integrates the signal to smooth it. This smoothed signal is fed to a voltage-controlled oscillator which generates an output signal with a frequency that is proportional to the input voltage. The VCO output is also fed back to the DPFD to form the PLL circuit.

In traditional analog PLL techniques, a phase and frequency detector converts the phase and frequency differences between the reference clock and the feedback clock into an analog signal. Depending on the technology, this signal can either be a voltage which can be applied directly to the loop filter or a current generated by a charge pump. One disadvantage of the analog PLL structures is the silicon integration. Due to spur reduction requirements, the loop filter requires large resistors and capacitors, typically connected externally to an IC chip, to achieve a low PLL bandwidth. Another major disadvantage of conventional PLLs is lack of portability from one process technology to another. Therefore, more and more PLL designers are attempting to use digital architectures to implement a PLL. One of the key function blocks of a digital PLL is a digital phase and frequency detector.

Typically, a digital phase and frequency detector is implemented based on a time-to-digital converter ("TDC"). Various approaches for digital phase and frequency detectors have been attempted but have draw backs, such as increased hardware resources, slow locking time, or degradation in performance. For instance, it is difficult to achieve a DPFD that has both accuracy and low complexity. Furthermore, a bang-bang PLL technique is simpler since it uses a one-bit polarity output DPFD, but is not accurate in high performance applications. Thus, the need exists for a digital phase and frequency detector that can reliably produce phase error signals and has relatively low complexity.

SUMMARY OF INVENTION

An object of this invention is to provide a digital phase and frequency detector that has at least two operating modes to optimize hardware resources, locking time, and power consumption based on the phase error detection.

Another object of this invention is to provide a digital phase and frequency detector that can adaptively switch between operating modes depending on a number of polarity changes of the phase error.

Yet another advantage of this invention is to provide a digital phase and frequency detector that can increase the resolution of the phase detection while minimizing the hardware resources to determine the phase error.

Briefly, the present invention relates to a method for digital phase detection, comprising the steps of: providing a reference clock; receiving a feedback clock; determining a timing difference between the reference clock and the feedback clock; determining a polarity that indicates the leading or lagging relationship between the reference clock and the feedback clock; selecting one of at least two operating modes for generating a quantized level indicative of the timing difference, wherein in a first operating mode the quantized level has only a polarity information and wherein in a second operating mode the quantized level has both a polarity information and a magnitude information, where the magnitude information is proportional to the input phase error.

An advantage of this invention is that a digital phase and frequency detector is provided that has at least two operating modes to optimize hardware resources, locking time, and power consumption based on the phase error detection.

Another advantage of this invention is that a digital phase and frequency detector is provided that can switch between operating modes depending on a number of polarity changes of the phase error.

Yet another advantage of the present invention is that a digital phase and frequency detector is provided that can increase the resolution of the phase detection while minimizing the hardware resources to determine the phase error.

DESCRIPTION OF THE DRAWINGS

The foregoing and other objects, aspects, and advantages of the invention will be better understood from the following detailed description of the preferred embodiment of the invention when taken in conjunction with the accompanying drawings in which.

DETAILED DESCRIPTION OF THE PREFERRED EMBODIMENTS

Figure 1:
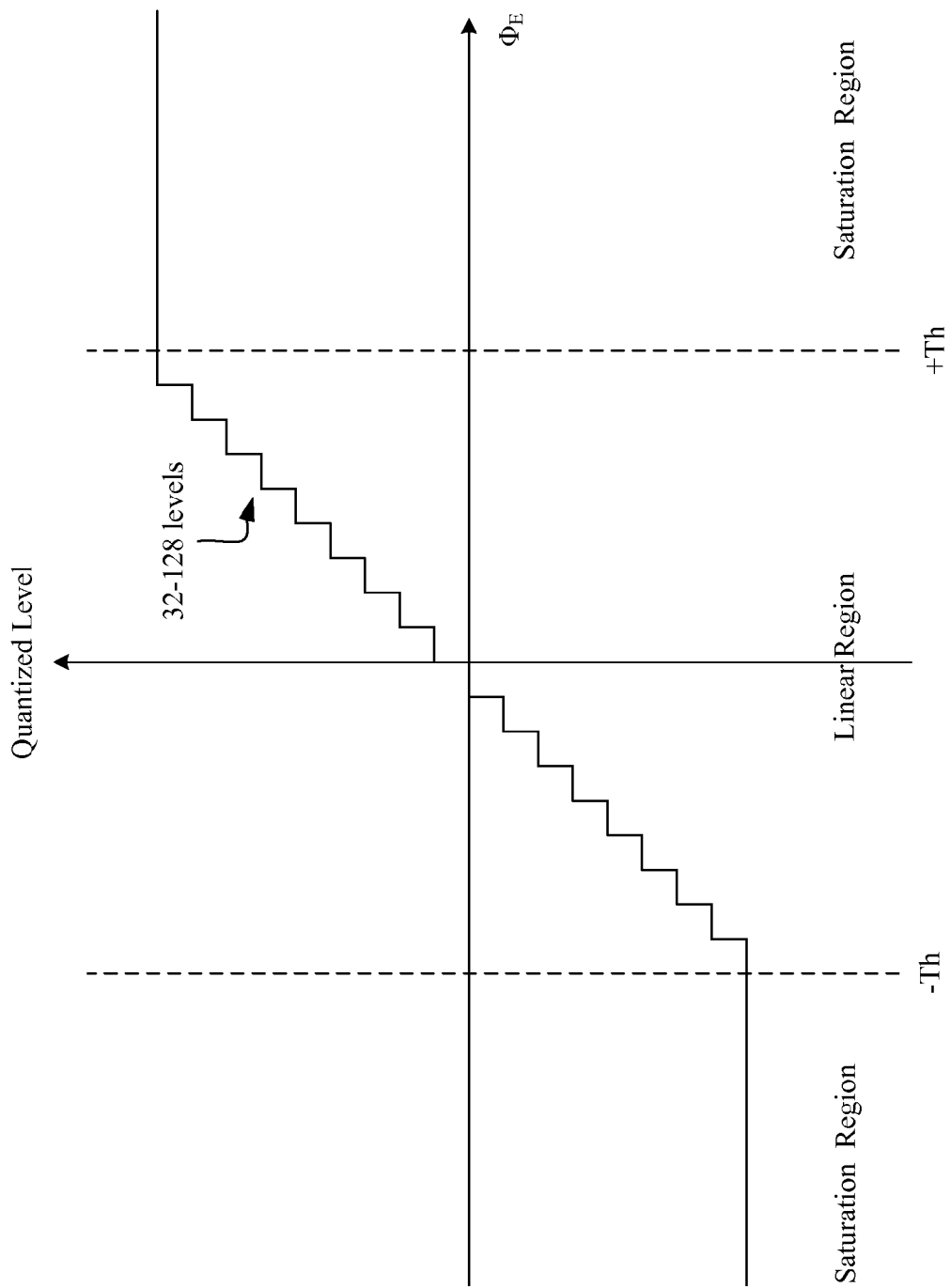
FIG. 1 illustrates a transfer curve for a digital phase and frequency detector of the present invention.

FIG. 1 illustrates a transfer curve for a digital phase and frequency detector of the present invention. A digital phase and frequency detector ("DPFD") of the present invention can have at least two operating modes, including a linear operating mode and a saturation operating mode. In the linear operating mode, the DPFD outputs a quantized level to represent both the polarity and magnitude of the input phase error, $\Phi_E$, between a first input signal, e.g. a reference clock, and a second input signal, e.g. a feedback clock. In the saturation operating mode, the DPFD outputs a maximum constant level to represent the polarity of the input phase error between the first input signal and the second input signal. A transfer curve can be used to represent the quantized levels of the digital phase and frequency detector as a function of the input phase error of the two signals. Furthermore, the transfer curve can have a saturation region where the DPFD is in a saturation operating mode and a linear region where the DFPD is in a linear operating mode.

If the input phase error ranges from a negative threshold value, −TH, to a positive threshold value, +TH, inclusively, then the input phase error can be converted to a quantized level according to a linear formula, e.g., $$DPFD_{out} = k_{DPFD} \times (T_{error}/t_{LSB}), \quad (1)$$

where $k_{DPFD}$ can be a value set by a user, $t_{LSB}$ is the delay of a buffer in the buffer chain, $T_{error}$ can be converted from the phase error and is given by the formula below:

$$T_{error} = (\phi_{phase\_error}/2\pi) \times T_{reference}, \quad (2)$$

where the $T_{reference}$ is a period of the reference clock. Depending on the application, the number of quantized levels can preferably range from 32 to 128 distinct levels for the output of the DPD.

When the input phase error is smaller than the negative threshold value, then a maximum negative quantized level is outputted to reflect this difference. When the phase difference is greater than the positive threshold value, then a maximum positive quantized level is outputted to reflect this difference. These two cases can be referred to as the saturation region on the transfer curve. The input phase error can be said to be in a saturation region, when the absolute value of input phase error falls in this region.

To aid in the understanding of the present invention, the following disclosed circuits relate to a DPFD having a saturation operating mode and a linear operating mode. However, it is understood that other equivalent circuits may be used to implement a DPFD having at least two operating modes.

Figure 2:
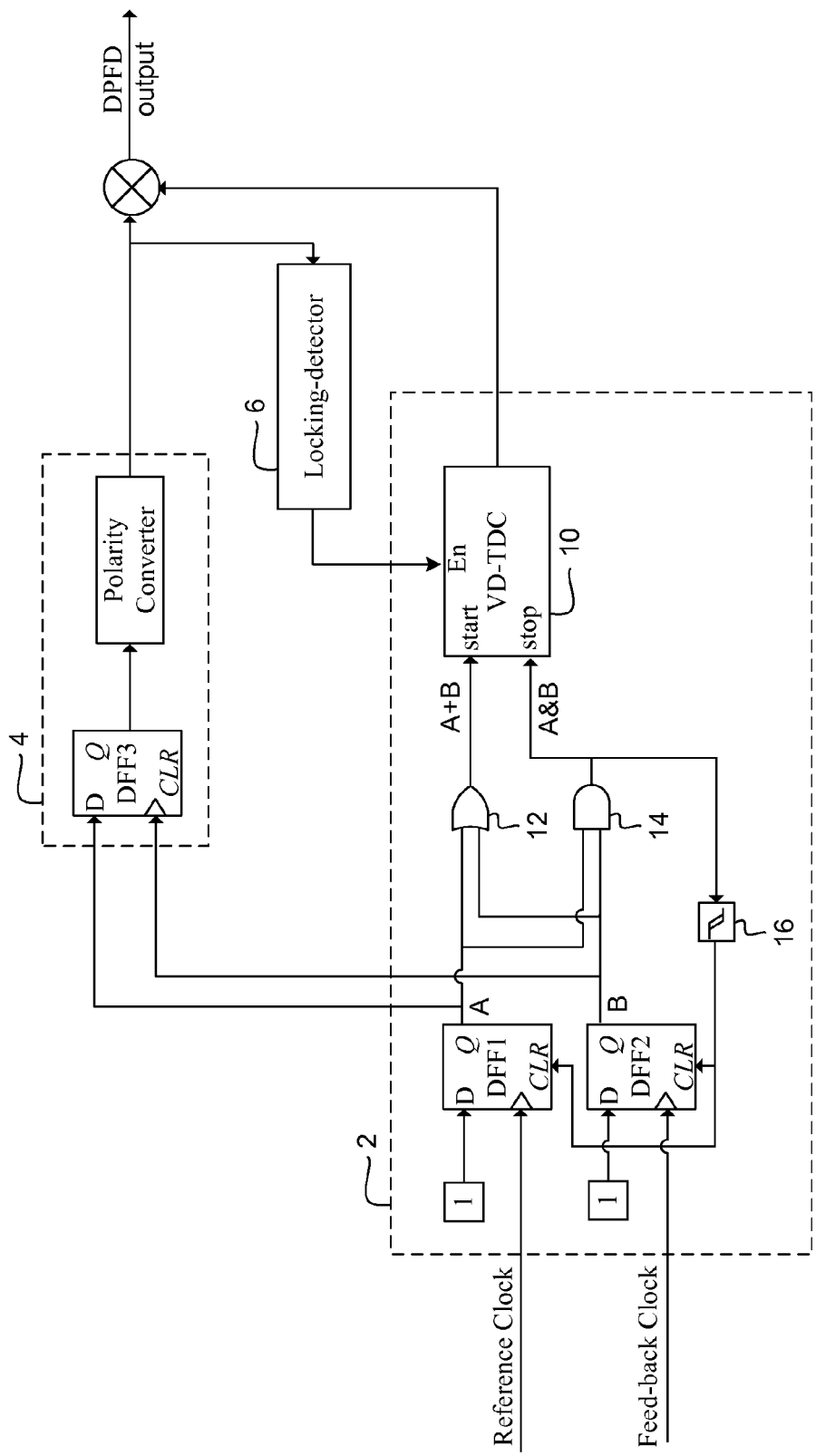
FIG. 2 illustrates a schematic for a digital phase and frequency detector of the present invention having a transfer curve with two operating modes.

FIG. 2 illustrates a schematic for a DPFD of the present invention having two operating modes. The DPFD comprises a phase error magnitude detector 2, a phase error polarity detector 4, and a locking detector 6.

The phase error magnitude detector 2 measures the magnitude of the phase difference between the reference clock and the feed-back clock. The phase error magnitude detector 2 comprises a clock edge interval generation circuit and a Vernier-Delay line time to digital converter ("VD-TDC") 10. The clock edge interval generation circuit generates the start and stop signals to be inputted to the VD-TDC 10. The clock edge interval generation circuit can generate a clock edge interval which is equal to the rising edge interval between the reference clock and the feed-back clock. Based on the start and stop signals, the phase error magnitude detector 2 can measure the input phase error.

The phase error polarity detector 4 determines whether the reference clock is leading or the feed-back clock is leading, and outputs the respective polarity to indicate that relationship. For instance, if the reference clock is leading the feed-back clock, then a positive polarity (e.g., a high value or a "1" value) may be outputted. Conversely if the reference clock is lagging the feed back clock, then a negative polarity (e.g., a low value or a "0" value) may be outputted.

The determined polarity and the calculated input phase error can be multiplied and outputted by the DPFD. The locking detector 6 can determine when a locking state has occurred by counting the number of polarity changes. If the number of polarity changes has reached a predefined number, then a locking flag is activated to indicate the locking state to the VD-TDC 10. The locking flag can be deactivated when the target frequency changes or a reset signal is received.

If the locking flag is activated, then the DPFD is operated in the linear operating mode, where the VD-TDC 10 outputs a quantized level corresponding to the input phase error. If the locking flag is not activated, then the DPFD is operated in the saturation operating mode, where the VD-TDC 10 outputs the maximum quantized level.

Figure 3:
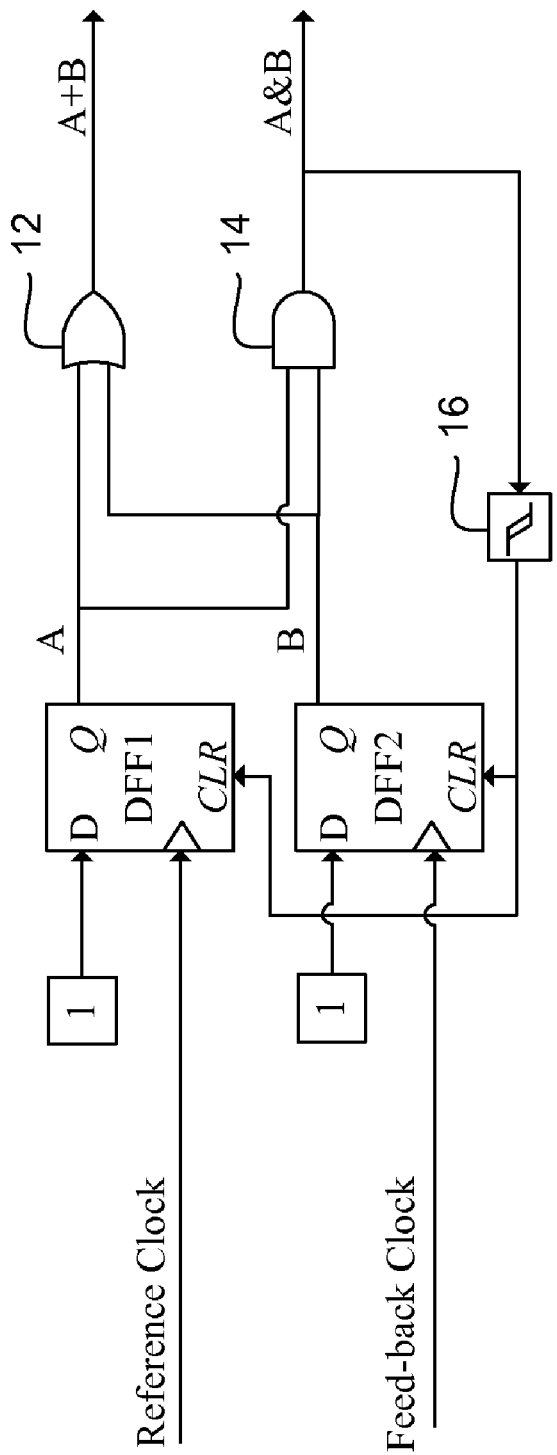
FIG. 3 illustrates a schematic for a clock edge interval generation circuit of the present invention.

FIG. 3 illustrates a schematic for a clock edge interval generation circuit. The clock edge interval generation circuit comprises a first data flip flop DFF1, a second data flip flop DFF2, a logic OR gate 12 and a logic AND gate 14, and a delay circuit 16. The delay circuit 16 can be used to overcome a "dead zone" problem. The first data type flip flop DFF1 receives the reference clock and a high signal (i.e., "1") on its input and outputs a signal A. The second data type flip flop DFF2 receives the feed-back clock and a high signal (i.e., "1") on its input and outputs a signal B. The signal A and signal B are applied to the logic OR gate 12. The logic OR gate 12 outputs the result (i.e., A+B) to the start input of the VD-TDC 10. The signal A and signal B are applied to the logic AND gate 14. The logic AND gate 14 outputs the result (i.e., A&B) to the stop input of the VD-TDC 10.

Figure 4:
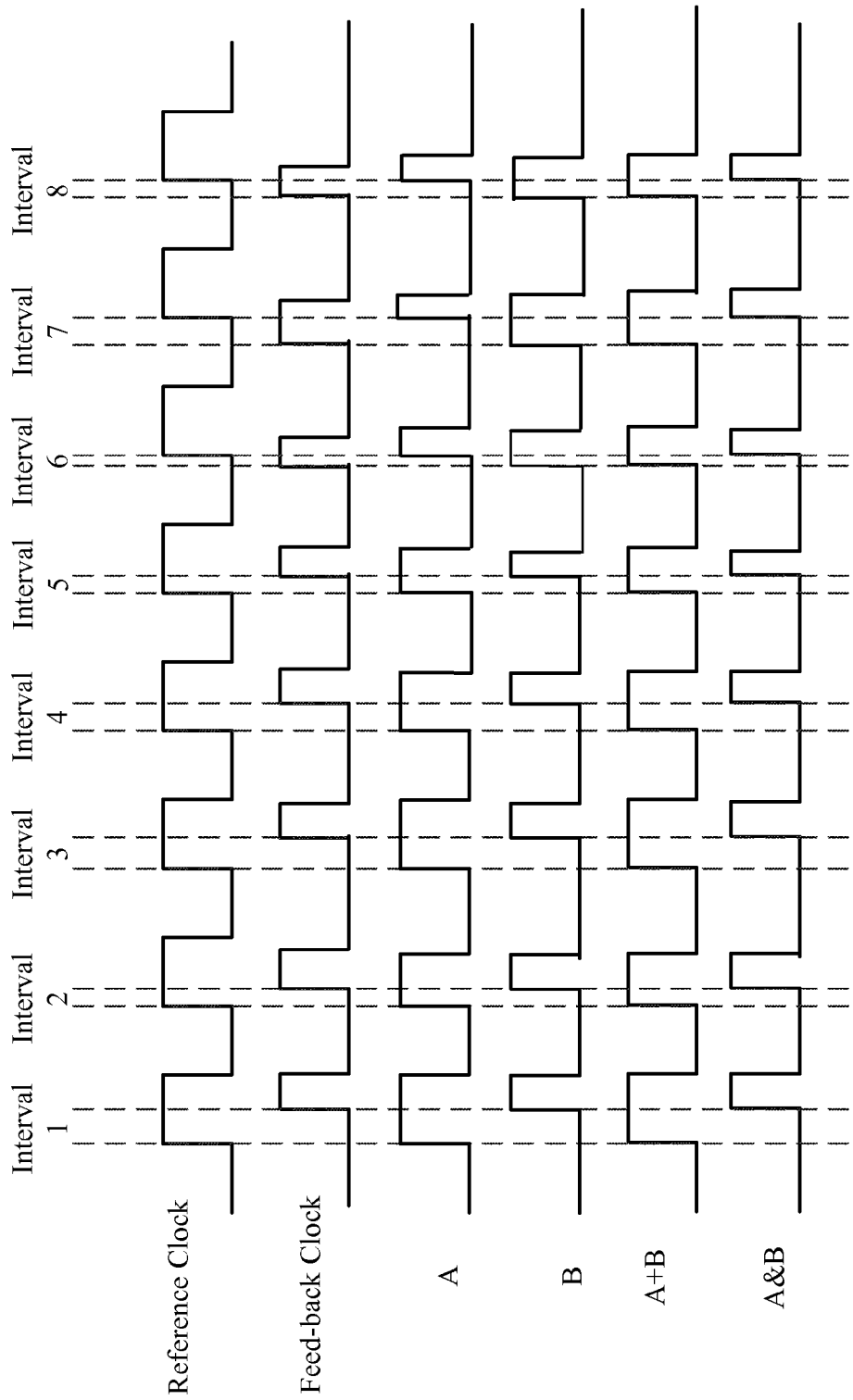
FIG. 4 illustrates a waveform diagram for various signals received and outputted by a clock edge interval generation circuit of the present invention.

FIG. 4 illustrates a waveform diagram for the various signals received and outputted by the clock edge interval generation circuit. The signals A and B follow the reference clock and feed-back clock, respectively. The signal A+B is high when one of the signals A or B is high. The signal A&B is high when both A and B are high. The input phase error difference is given by the intervals 1-8 which illustrate the difference in phase between the reference clock and the feed-back clock for a given time interval.

Figure 5:
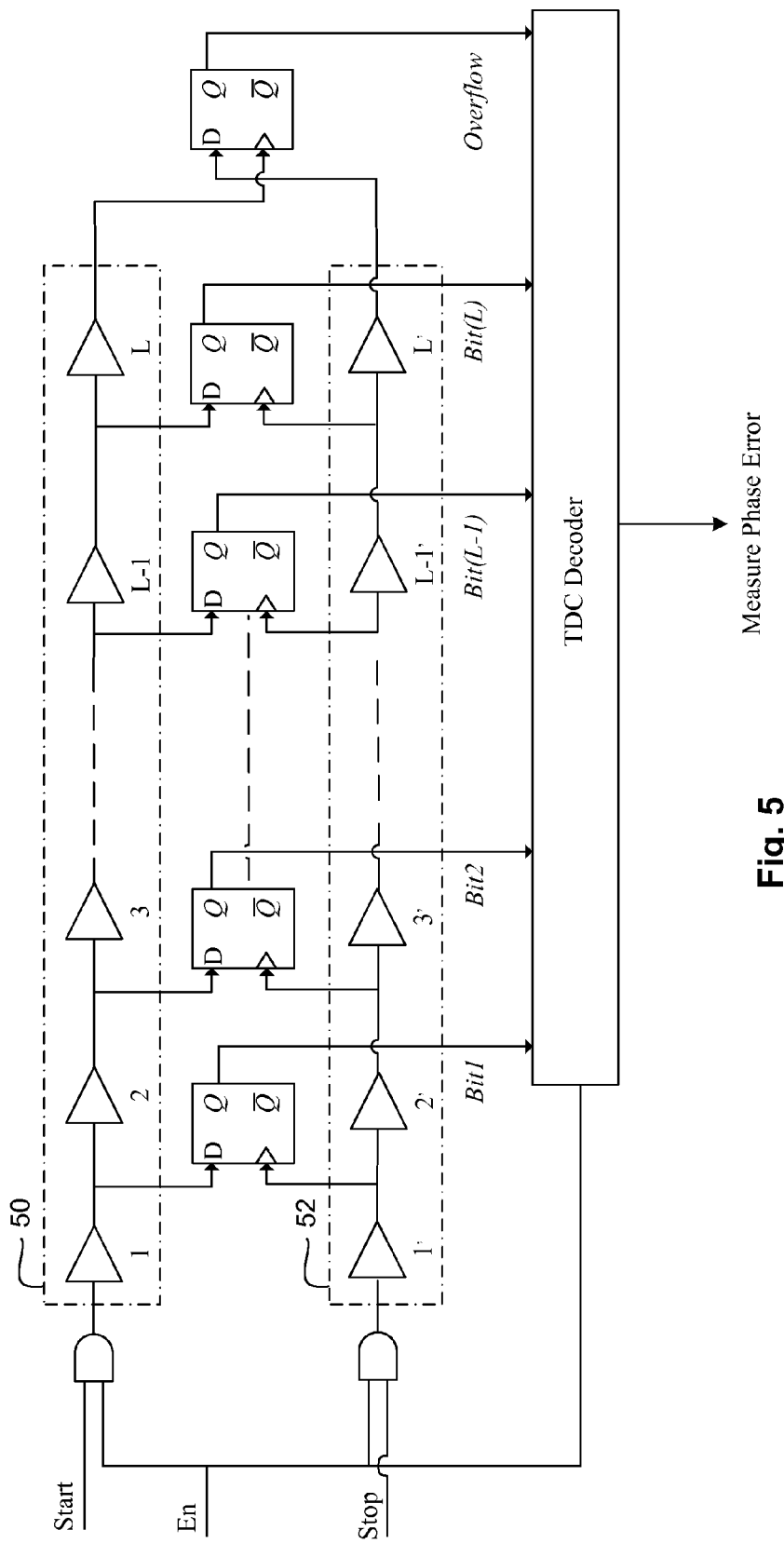
FIG. 5 illustrates a Vernier-Delay line time-to-digital converter of the present invention.

FIG. 5 illustrates a VD-TDC of the present invention having a slow buffer chain and a fast buffer chain. The VD-TDC comprises a slow buffer chain 50, a fast buffer chain 52, an overflow circuit, and a TDC decoder, where each of the buffer chains has L buffers. The delay of a single buffer of the slow buffer chain is T1 where the counterpart of the fast buffer chain is T2. T1 must be larger than T2 to guarantee a proper operation of the VD-TDC. The resolution of the VD-TDC is determined by the difference between T1 and T2. The non-saturation range of the VD-TDC depends both on the T1 and T2 difference and the number of the delay stages in a chain.

The delay of a buffer in the slow chain is slightly greater than the delay of a buffer in the fast chain. As the start and stop signals propagate to their respective delay chains, the timing difference between the buffers is decreased in each Vernier stage by the difference in the buffer delays.

In each stage, the signals are fed into an arbiter circuit (e.g., a DFF in the VD-TDC of the present invention), which decides which of the two pulses is leading. The position in the delay line at which the stop signal catches up with the start signal gives information about the measured time between the start and stop signals.

Depending on the application, the resolution (which can be equal to the difference in buffer delays) is made less than several picoseconds and the non-saturation range of the VD-TDC is made less than 2 to 4 digital controlled oscillator ("DCO") periods, e.g., the highest frequency generator in a DPLL. When the time interval between the start and stop signal is larger than the non-saturation range of the VD-TDC, the VD-TDC will generate an overflow signal and the output of the VD-TDC will be a constant maximum value.

Referring to FIG. 2, the phase error polarity detector 4 comprises a data type flip-flop DFF3 and a polarity converter. It is to be understood that the phase error polarity detector 4 can be implemented by other equivalent circuits for polarity detection. When the signal B has a rising edge, the DFF3 can sample the valve of the signal A. If the sampled value is high, the polarity converter will output a positive sign flag. Alternatively, if the sampled value is low, the polarity converter will output a negative sign flag. Once the polarity of the signal is determined, the output of the phase error magnitude detector 2 and the phase error polarity detector 4 are combined (e.g., multiplied together) to generate the DPFD output signal.

Figure 6:
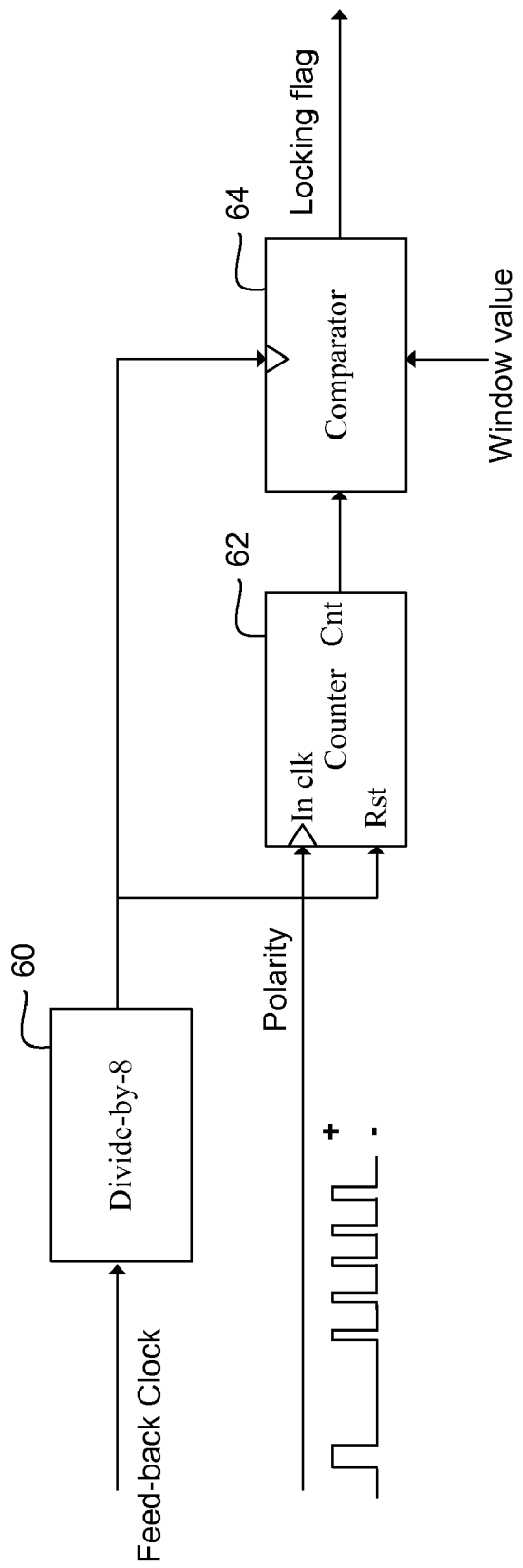
FIG. 6 illustrates a schematic for a locking detector of the present invention to determine whether a "locking" state is met.

FIG. 6 illustrates a block diagram for a locking detector of the present invention. The structure of the locking detector comprises a clock dividing circuit 60, a cyclic reset counter 62, and a comparator 64. When a PLL is close to a locking state, the polarity of the input phase error will hop between positive and negative polarities. The cyclic reset counter 62 can count the number of the polarity transitions. Every predefined number of feed-back clock cycles (e.g., 8), the comparator 64 will compare the output value of the counter 62 with a window value, where the window value can be one or more criteria set by a user to judge whether the loop is locked or not. If the window value is less than the counted number, the locking flag will change from a low signal to a high signal to predict the PLL is close to a locking state.

At the initial state when the PLL is not locking, the input phase error (or the distance between the rising edges of the reference clock and the feed-back clock) at the input of the DPFD is much larger than the non-saturation range of the VD-TDC. Thus, the VD-TDC can be operating in the saturation operating mode. Under this condition, the locking flag of the locking detector will be a low signal, which will turn off the buffer chains of the VD-TDC to save power. Thus, when the VD-TDC is off, the output of the VD-TDC can be treated as overflow. In the saturation operating mode, the decoder of the VD-TDC will output a constant maximum level until the locking flag goes to a high signal.

Figure 7:
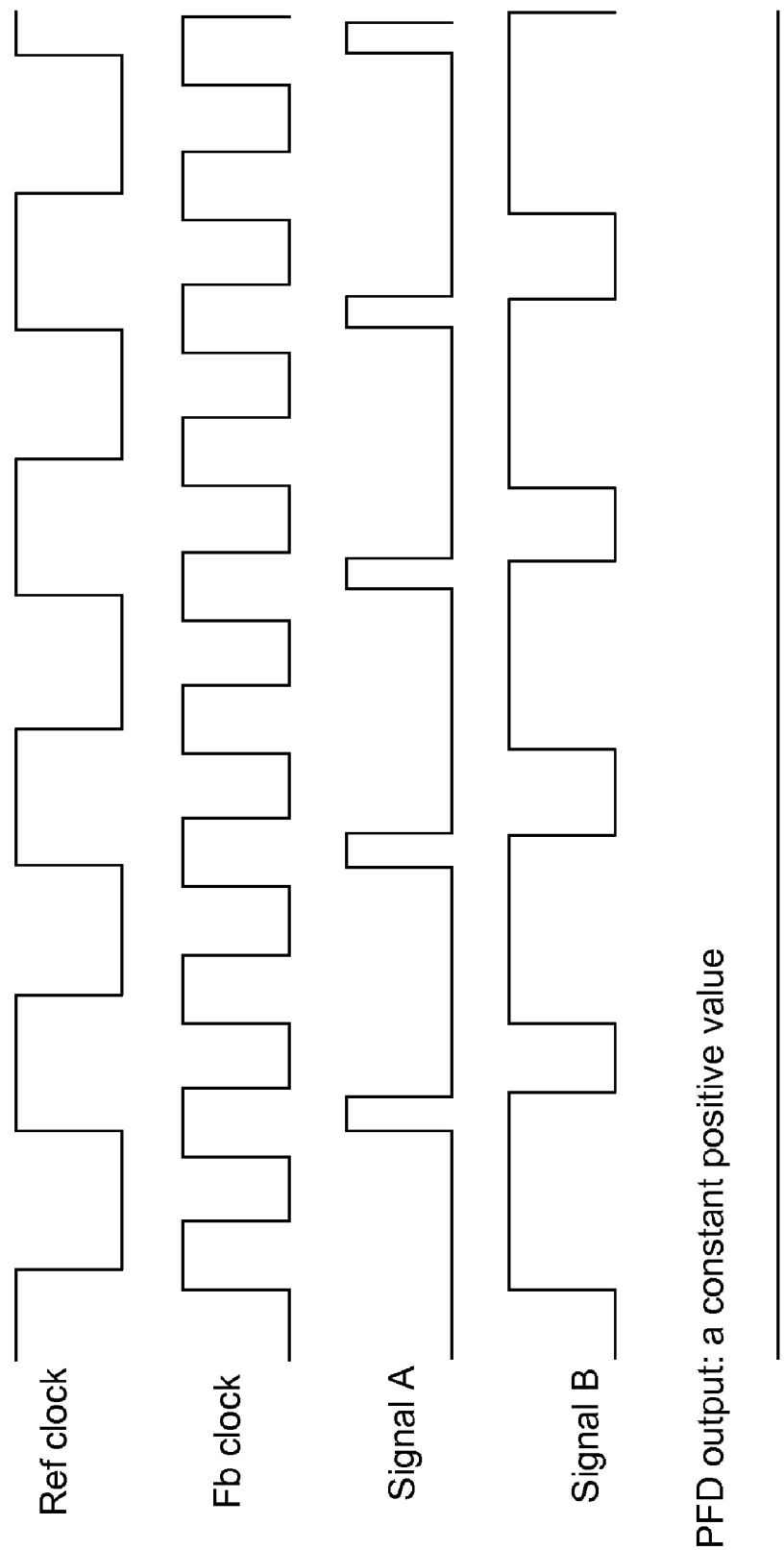
FIG. 7 illustrates a waveform diagram for various signals of a digital phase and frequency detector of the present invention.

In addition to phase detection, the DPFD can also detect frequency errors between the reference clock and the feedback clock. FIG. 7 illustrates a waveform diagram for various signals of a digital phase and frequency detector of the present invention, where the frequency differs between the reference clock and the feedback clock. In this example, the reference clock can be at 40 Mhz with a 25 ns initial delay and the feed back clock can be at 80 Mhz with a 0 ns initial delay.

When the reference clock is much slower than the feedback clock, signal B will be reset after a small amount of time when signal A goes high. The rising edge of signal A is lagging the rising edge of the signal B. Furthermore, the output of the phase error polarity detector (e.g., DFF3) is low, which means a negative polarity. Thus, this kind of DPFD output corresponds to a negative frequency error between the reference clock and the feedback clock. Therefore, the DPFD can adjust the frequency of the feedback clock accordingly to compensate for the negative frequency error.

Conversely, when the reference clock is much faster than the feedback clock, the output of the phase error polarity detector (e.g., DFF3) will always be high, which corresponds to a positive frequency error between the reference clock and the feedback clock. Thus, the DPFD can also adjust the frequency of the feedback clock accordingly to compensate for the positive frequency error.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A method for digital phase detection, comprising the steps of:
   providing a reference clock;
   receiving a feedback clock;
   determining a timing difference between the reference clock and the feedback clock;
   determining a polarity that indicates the leading or lagging relationship between the reference clock and the feedback clock;
   selecting one of at least two operating modes for generating a quantized level indicative of the timing difference, wherein in a first operating mode the quantized level is a maximum negative or positive value and wherein in a second operating mode the quantized level is proportional to the timing difference; and
   generating a digital phase detection output as a function of the polarity and the quantized level.

2. The method of claim 1 wherein if the timing difference ranges from a negative threshold value to a positive threshold value, then the second operating mode is selected.

3. The method of claim 2 wherein if the timing difference is smaller than the negative threshold value or greater than the positive threshold value, the first operating mode is selected.

4. The method of claim 1 wherein if the timing difference is smaller than a negative threshold value or greater than a positive threshold value, the first operating mode is selected.

5. The method of claim 1 wherein the first operating mode is selected until a locking flag indicative of a locking state is activated.

6. The method of claim 5 wherein the second operating mode is selected when the locking flag is activated.

7. The method of claim 5 wherein the locking flag is activated when a predefined number of polarity changes have occurred.

8. The method of claim 1 in the generating step, wherein the digital phase detection output is generated by a combination of the polarity and the quantized level.

9. The method of claim 1 wherein a frequency error between the reference clock and the feedback clock is determined as a function of the polarity.

10. A digital phase and frequency detector, comprising:
    a phase error magnitude detector; and
    a phase error polarity detector;
    wherein a reference clock and a feedback clock are inputted to the phase error magnitude detector;
    wherein the phase error magnitude detector determines a timing difference between the reference clock and the feedback clock;
    wherein the phase error polarity detector determines a polarity that indicates the leading or lagging relationship between the reference clock and the feedback clock;
    wherein the phase error magnitude detector selects one of at least two operating modes for generating a quantized level indicative of the timing difference, wherein in a first operating mode the quantized level is a maximum value and wherein in a second operating mode the quantized level is proportional to the timing difference; and
    wherein the digital phase and frequency detector generates an output as a combination of the polarity and the quantized level.

11. The digital phase and frequency detector of claim 10 wherein if the timing difference ranges from a negative threshold value to a positive threshold value, then the second operating mode is selected.

12. The digital phase and frequency detector of claim 11 wherein if the timing difference is smaller than the negative threshold value or greater than the positive threshold value, the first operating mode is selected.

13. The digital phase and frequency detector of claim 10 wherein if the timing difference is smaller than a negative threshold value or greater than a positive threshold value, the first operating mode is selected.

14. The digital phase and frequency detector of claim 10 further comprising a locking detector, wherein the first operating mode is selected until a locking flag indicative of a locking state is activated by the locking detector.

15. The digital phase and frequency detector of claim 14 wherein the first operating mode is selected when the locking flag is deactivated.

16. The digital phase and frequency detector of claim 14 wherein the locking flag is activated when a predefined number of polarity changes have occurred.

17. The digital phase and frequency detector of claim 14 wherein the locking detector comprises a dividing circuit, a cyclic reset counter, and a comparator, wherein the cyclic reset counter tracks the number of polarity transitions, and wherein the locking flag is generated by the comparator as a function of the number of polarity changes and a window value.

18. The digital phase and frequency detector of claim 17 wherein the comparator compares the number of polarity changes with the window value, wherein if the window value is less than the number of polarity changes, the locking flag is activated.

19. The digital phase and frequency detector of claim 10 wherein the phase error magnitude detector comprises a clock edge interval generation circuit and a Vernier-Delay line time to digital converter ("VD-TDC"), wherein the clock edge interval generation circuit receives the reference clock and the feed-back clock to generate start and stop input signals for the VD-TDC, and wherein the VD-TDC is operated according to one of the operating modes.

20. The digital phase and frequency detector of claim 19 wherein the VD-TDC comprises a slow buffer chain, a fast buffer chain, an overflow circuit, and a TDC decoder.

21. The digital phase and frequency detector of claim 20 wherein if a locking flag is deactivated, the slow buffer chain and the fast buffer chain are turned off.

22. The digital phase and frequency detector of claim 20 wherein if a locking flag is activated, the slow buffer chain and the fast buffer chain are turned on.

23. The digital phase and frequency detector of claim 10 wherein a frequency error between the reference clock and the feedback clock is determined as a function of the polarity.

* * * * *